United States Patent
Huen et al.

(10) Patent No.: US 11,837,319 B2
(45) Date of Patent: *Dec. 5, 2023

(54) MULTI-PORT MEMORY DEVICE AND A METHOD OF USING THE SAME

(71) Applicant: SAMSUNG ELECTRONICS CO., LTD., Suwon-si (KR)

(72) Inventors: Hingkwan Huen, Daly City, CA (US); Changho Choi, San Jose, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 87 days.

This patent is subject to a terminal disclaimer.

(21) Appl. No.: 17/118,238

(22) Filed: Dec. 10, 2020

(65) Prior Publication Data

US 2021/0090619 A1    Mar. 25, 2021

Related U.S. Application Data

(60) Continuation of application No. 16/234,362, filed on Dec. 27, 2018, now Pat. No. 10,867,643, which is a division of application No. 15/097,234, filed on Apr. 12, 2016, now Pat. No. 10,255,955.

(60) Provisional application No. 62/293,293, filed on Feb. 9, 2016.

(51) Int. Cl.
*G06F 3/06*       (2006.01)
*G11C 7/10*      (2006.01)

(52) U.S. Cl.
CPC .......... *G11C 7/1075* (2013.01); *G06F 3/0613* (2013.01); *G06F 3/0659* (2013.01); *G06F 3/0685* (2013.01)

(58) Field of Classification Search
CPC ... G11C 7/1075; G06F 3/0613; G06F 3/0659; G06F 3/0685
See application file for complete search history.

(56) References Cited

U.S. PATENT DOCUMENTS

| | | | |
|---|---|---|---|
| 7,899,443 B2 | 3/2011 | Moran et al. | |
| 7,962,698 B1 | 6/2011 | Yadav et al. | |
| 8,533,384 B2 | 9/2013 | Olbrich et al. | |
| 8,589,723 B2 | 11/2013 | Kumar et al. | |
| 2001/0002480 A1* | 5/2001 | Dekoning | G06F 3/0658 711/135 |

(Continued)

*Primary Examiner* — Jae U Yu
(74) *Attorney, Agent, or Firm* — Lewis Roca Rothgerber Christie LLP

(57) ABSTRACT

A multi-port memory device in communication with a controller includes a memory array for storing data provided by the controller, a first port coupled to the controller via a first controller channel, a second port coupled to the controller via a second controller channel, a processor, and a processor memory local to the processor, wherein the processor memory has stored thereon instructions that, when executed by the processor, cause the processor to: enable data transfer through the first port and/or the second port in response to a first control signal received from the first controller channel and/or a second control signal received from second controller channel, decode at least one of the received first and second control signals to identify a data operation to perform, the identified data operation including a read or write operation from or to the memory array, and execute the identified data operation.

20 Claims, 6 Drawing Sheets

(56) References Cited

U.S. PATENT DOCUMENTS

| | | |
|---|---|---|
| 2004/0010667 A1 | 1/2004 | Brenner |
| 2009/0164693 A1 | 6/2009 | Andersen |
| 2009/0210611 A1 | 8/2009 | Mizushima |
| 2011/0320698 A1 | 12/2011 | Wang et al. |
| 2012/0117354 A1* | 5/2012 | Tatsumura .......... H04L 12/6418 |
| | | 711/E12.002 |
| 2014/0215277 A1 | 7/2014 | Judd |
| 2015/0006663 A1 | 1/2015 | Huang |
| 2015/0255130 A1 | 9/2015 | Lee et al. |
| 2015/0317272 A1 | 11/2015 | Tanaka et al. |

* cited by examiner

MULTI-PORT MEMORY DEVICE AND A METHOD OF USING THE SAME

CROSS-REFERENCE TO RELATED APPLICATION(S)

The present application is a continuation of U.S. patent application Ser. No. 16/234,362, filed Dec. 27, 2018, which is a divisional of U.S. patent application Ser. No. 15/097,234, filed Apr. 12, 2016, now U.S. Pat. No. 10,255,955, which claims priority to, and the benefit of, U.S. Provisional Application No. 62/293,293 ("METHOD TO IMPROVE IO DURING GARBAGE COLLECTION WITH DUAL PORT NAND"), filed on Feb. 9, 2016, the entire contents of all of which are incorporated herein by reference.

FIELD

Aspects of the present invention relate to a multi-port memory device and a method of using the same in a non-volatile, solid state drive.

BACKGROUND

Every day, several quintillion bytes of data may be generated around the world. This data may come from posts to social media sites, online videos, financial transactions, sensory information gathered by sensors around the world, etc. This vast amount of data is generally stored and maintained in storage nodes, such as solid-state storage drives (SSDs), and the like, which may reside on local networks or on internet-accessible storage. This stored data may then undergo further processing, such as search, encryption/decryption, compression/decompression, and/or other processes. In a server platform, for example, a processing device, such as a central processing unit (CPU), performs operations on the data. The data may be read from the SSD, processed by the CPU, and the processed data may be sent to the source of a request.

The SSD may include non-volatile memory (e.g., flash memory) for storage of data and a controller that facilitates the transfer of data to and from the non-volatile memory. The controller may be capable of queuing multiple read and write command requests from a host (e.g., a server). As such, the controller may send more than one request at a time to the non-volatile memory, thus, improving the overall performance of the SSD. The controller reads/writes data from/to the non-volatile memory through a number of channels. The non-volatile memory may comprise a plurality of memory devices (e.g., NAND devices) that are organized as groups of devices, where each group of memory devices is connected to a corresponding one of the controller channels.

When a controller channel services a read/write request (i.e., an input/output or I/O request), concurrent access to any of the memory devices from the same occupied channel is not possible. That is, when one memory device at a channel is being used in an I/O operation, all other memory devices on that same channel remain idle until the I/O operation is complete. This idle time presents an overhead for the controller that directly affects the performance and latency of the SSD.

The above information disclosed in this Background section is only for enhancement of understanding of the invention, and therefore it may contain information that does not form the prior art that is already known to a person of ordinary skill in the art.

SUMMARY

Aspects of embodiments of the present invention are directed toward a multi-port (e.g., a dual-port) memory device configured to receive and process data transfer requests through either or both of a first and second input/output (I/O) ports, each of the two ports being coupled to and controlled by separate channels of a controller.

Aspects of embodiments of the present invention are directed to a solid state drive utilizing the multi-port (e.g., the dual-port) memory device and a method of operating the same.

According to some example embodiments of the invention, there is provided a multi-port memory device in communication with a controller, the multi-port memory device including: a memory array for storing data provided by the controller; a first port coupled to the controller via a first controller channel; a second port coupled to the controller via a second controller channel; a processor; and a processor memory local to the processor, wherein the processor memory has stored thereon instructions that, when executed by the processor, cause the processor to: enable data transfer through the first port and/or the second port in response to a first control signal received from the first controller channel and/or a second control signal received from second controller channel; decode at least one of the received first and second control signals to identify a data operation to perform, the identified data operation including a read or write operation from or to the memory array; and execute the identified data operation.

According to some example embodiments of the invention, there is provided a storage node including: a plurality of multi-port memory devices arranged in rows of multi-port memory devices, each of the multi-port memory devices having a first port and a second port, each of the first and second ports being configured to receive data transfer requests; and a controller configured to perform data transfer to/from the plurality of multi-port memory devices through a plurality of control channels, wherein the first and second ports of each of the plurality of multi-port memory devices are coupled to two of the plurality of control channels.

According to some example embodiments of the invention, there is provided a method of performing data transfer in a multi-port memory device, the method including: receiving a first control signal through a first port of the multi-port memory device, the first control signal indicating a first data transfer request from a controller of a storage node; enabling a first data transfer through the first port and blocking memory access through a second port of the multi-port memory device; decoding the first control signal to identify the first data transfer request; and initiating the first data transfer to or from a memory array of the multi-port memory device according to the identified first data transfer request.

BRIEF DESCRIPTION OF THE DRAWINGS

The above and other features and aspects of the invention will be made more apparent by the following detailed description of example embodiments thereof with reference to the attached drawings, in which.

DETAILED DESCRIPTION

Figure 1:
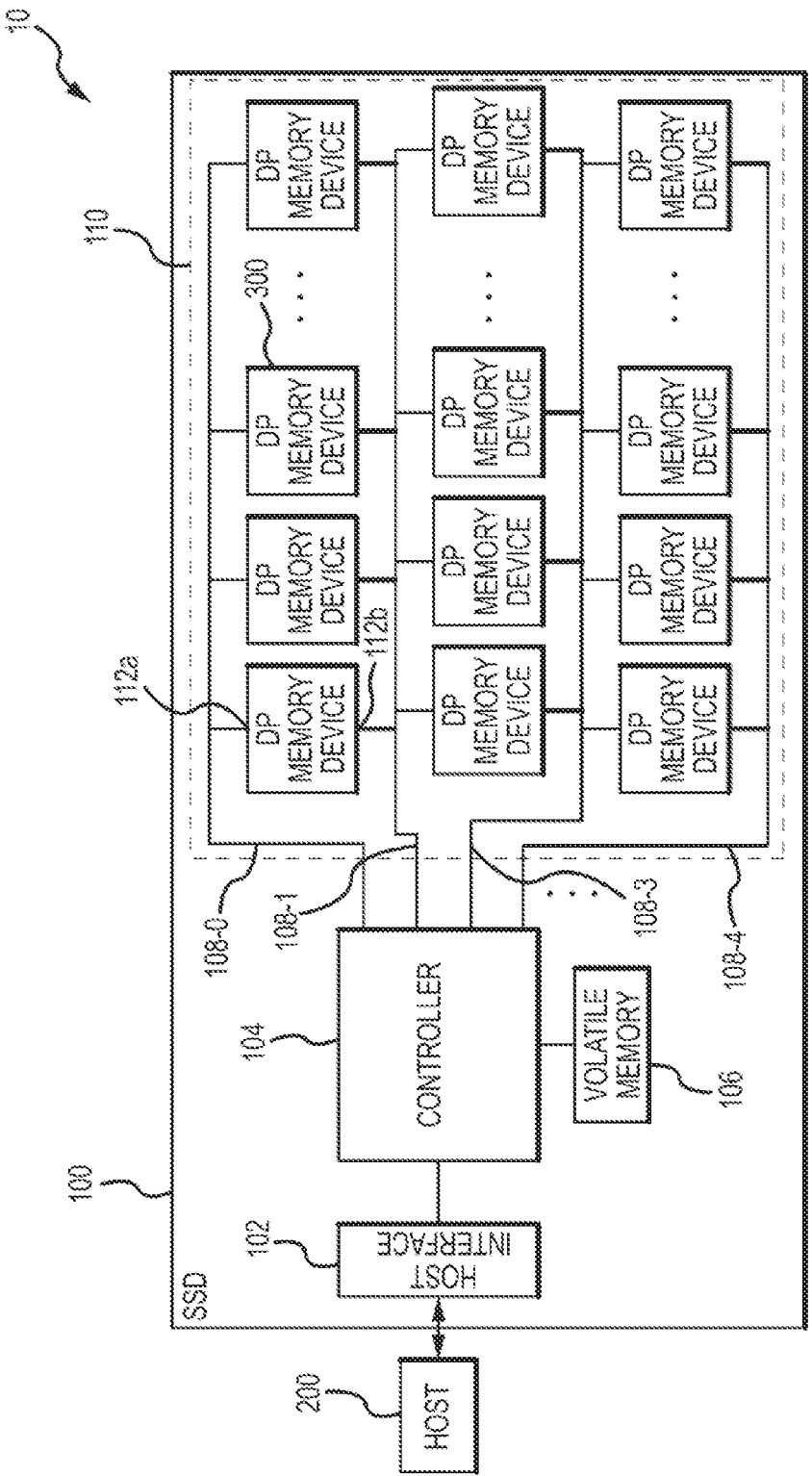
FIG. 1 is a block diagram of a system, which includes a storage node in communication with a host for performing read/write operations on multi-port memory devices, according to some example embodiments of the present invention.

The attached drawings for illustrating example embodiments of the invention are referred to in order to provide a sufficient understanding of the invention, the merits thereof, and the objectives accomplished by the implementation of the invention. The invention may, however, be embodied in many different forms and should not be construed as being limited to the example embodiments set forth herein; rather, these example embodiments are provided so that this disclosure will be thorough and complete, and will fully convey the concept of the invention to those skilled in the art.

Hereinafter, the invention will be described in detail by explaining example embodiments of the invention with reference to the attached drawings. In the drawings, like reference numerals are used throughout the figures to reference like features and components.

FIG. 1 is a block diagram of a system 10 including a storage node 100 in communication with a host 200 for performing read/write operations on multi-port (e.g., dual-port) memory devices, according to some example embodiments of the present invention.

Referring to FIG. 1, the storage node (e.g., the solid-state drive (SSD)) 100 performs data transfer requests, such as read data requests or write data requests, in response to requests from the host (e.g., server) 200. In some examples, the host 200 and the storage node 100 may be implemented in a cloud-based computing environment. The host 200 and the storage node 100 may communicate using any suitable storage bus, such as PCIe, and any suitable protocol that runs on it. In other embodiments, a storage node 100 may be connected to, and controlled by, a host central processing unit (CPU), which may be a server CPU or a CPU in an application not configured as a server.

As used herein, the phrase "in communication with" refers to direct communication with, or indirect communication with, via one or more components named or unnamed herein. The storage node 100 and the host 200 may be in communication with each other via a wired or wireless connection. For example, in an embodiment, the storage node 100 may include a connector having pins (or a socket) to mate with a corresponding socket (or pins) on the host 200 to establish an electrical and physical connection. In another example, the storage node 100 can include a wireless transceiver to place the storage node 100 and the host 200 in wireless communication with each other. The storage node 100 and the host 200 may be separately housed from each other, or contained in the same housing. The storage node 100 and the host 200 may include additional components that, to simplify the drawing, are not shown in FIG. 1.

According to an embodiment of the present invention, the storage node 100 includes a host interface 102, a controller 104, a volatile memory (e.g., dynamic random access memory (DRAM)) 106, and a non-volatile memory (e.g., flash memory) 110 including a plurality of multi-port (e.g., dual-port) memory devices (e.g., dual-port flash dies or NAND flash chips) 300. The controller 104 facilitates the transfer of data to and from the storage node 100. The host interface 102 acts as an intermediary or communication medium between the host 200 and the controller 104 facilitating communication therebetween. The data transfers to and from the host 200 may be staged in an internal data buffer of the storage node 100 (i.e., the volatile memory 106) to adjust for different data formats between the non-volatile memory 110 and the host 200.

The storage node 100 may have a plurality of bi-directional channels (e.g., flash channels) acting as conduits for transferring data to and from the non-volatile memory 110. Each of the channels 108-0, 108-1 . . . 108-N may correspond to (e.g., be electrically coupled to) one or more multi-port memory devices 300. Having a number of channels enables parallel processing of the write and read commands by the controller 104 as, for example, at any given time, one channel (e.g., 108-0) may be writing to a set (e.g., row) of multi-port memory devices 300, while another channel (e.g., 108-1) may be reading from a different set (e.g., row) of multi-port memory devices 300.

The controller 104 is configured to be capable of queuing operations in order to increase (e.g., optimize) performance of the data transfers to and from the host 200. As such, the host 200 may send several command requests to the storage node 100, and the controller 104 may pre-process the commands and send more than one request at a time to the non-volatile memory 110, thus, improving (e.g., increasing) the overall performance of the storage node 100.

According to some embodiments, each of the multi-port memory devices 300 has first and second addressable ports (i.e., input/output (I/O) ports) 112a and 112b, which are configured to receive data transfer requests from the controller 104. The first and second ports 112a and 112b include physical connectors and electrical circuits that electrically couple the multi-ports of the memory device 300 to channels of the controller 104.

As illustrated in FIG. 1, according to some embodiments, some of the controller channels are shared among adjacent multi-port memory devices. For example, a first channel 108-0 may be coupled to the first ports 112a of a first row of multi-port memory devices 300, and a second channel 108-1 may be coupled to both the first ports 112a of a second row of multi-port memory devices 300 and second ports 112b of the first row of multi-port memory devices 300. Similarly, the third channel 108-2 may be commonly shared between (i.e., electrically coupled to both of) the second ports 112b of the second row of multi-port memory devices 300 and the first ports 112a of the third row of multi-port memory devices 300. Therefore, in an embodiment in which the non-volatile memory 110 is organized into N rows of memory devices 300 (where N is an integer greater than 2), the controller 104 can have N+1 channels, where the first and $(N+1)^{th}$ channel (i.e., 108-0 and 108-N) are coupled to only the first and $N^{th}$ row of memory devices 300, while the remaining channels are each shared among a corresponding two consecutive rows of memory devices 300. Thus, in such embodiments, the controller 104 may have one extra channel as compared to a comparable device utilizing single-port memory devices.

In some embodiments, the connection of controller channels to rows of memory devices 300 may have a circular configuration. That is, in an embodiment having N rows of memory devices 300, rather than connecting the second ports 112b of the $N^{th}$ row of memory devices 300 to an $(N+1)^{th}$ channel, said second ports 112b may be coupled to the first channel 108-0. In such an embodiment, the number of channels equals the number of rows. In other words, in such embodiments, every controller channel is shared by and coupled to two adjacent (e.g., consecutive) rows of memory devices 300.

The use of multi-port memory devices 300 and shared (or common) channels enables the storage node 100 to access a memory device 300 (e.g., for a read or write operation) that is attached to a channel that is busy servicing a request or performing data transfer with another memory device 300. This increased device availability is particularly desirable in reducing the overhead associated with certain operations, such as garbage collection, and leads to enhanced performance in servicing host requests.

Figure 2:
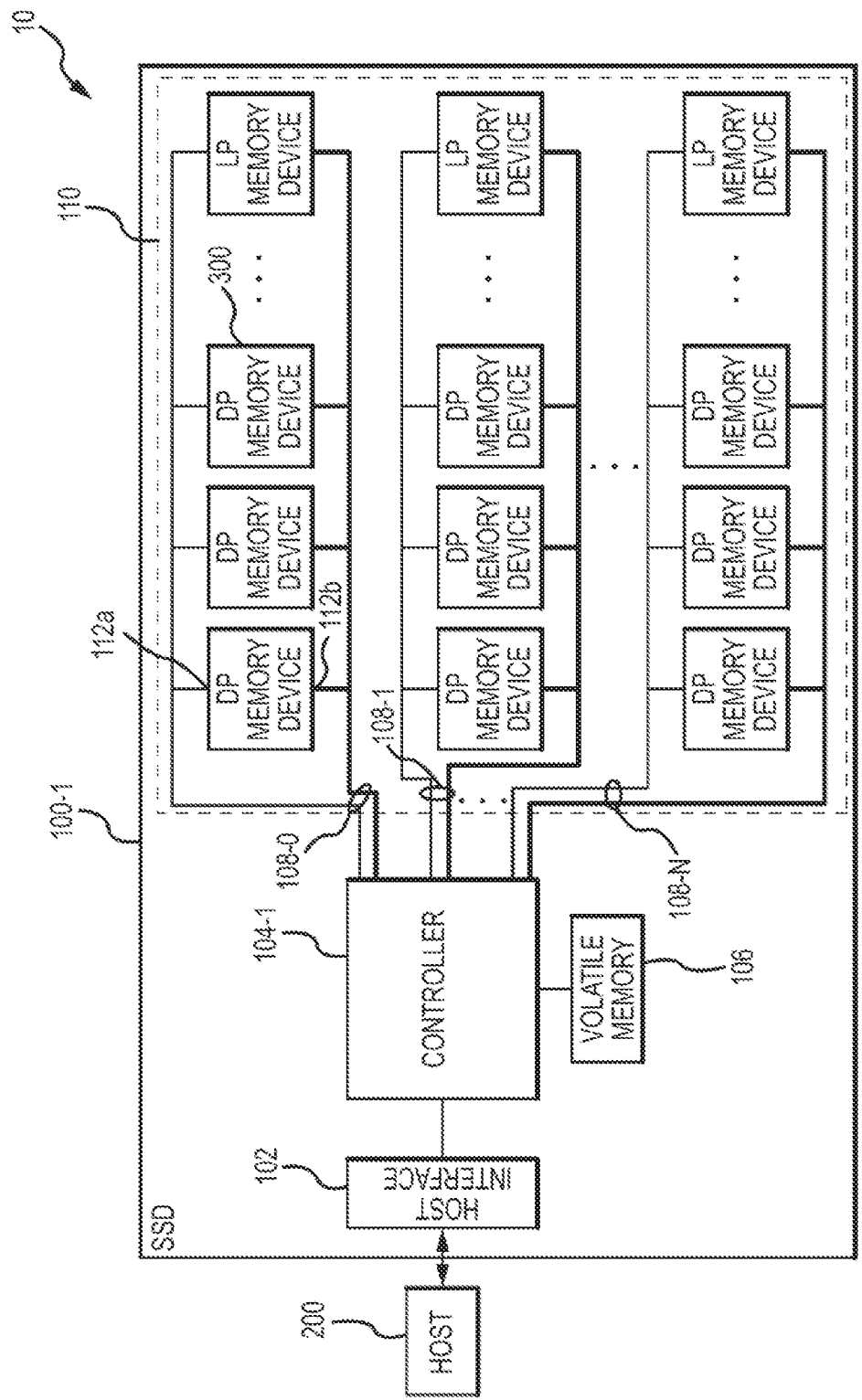
FIG. 2 is a block diagram of a system including a storage node in communication with a host for performing read/write operations on multi-port memory devices, according to some other example embodiments of the present invention.

FIG. 2 is a block diagram of a system 10-1 including a storage node 100-1 in communication with a host 200 for performing read/write operations on multi-port memory devices 300, according to some other example embodiments of the present invention. The system 10-1 and the storage node 100-1 are substantially similar in structure and operation to the system 10 and the storage node 100, respectively, with the exception of channel allocation. Hence, a description of the operation and structure of the similar components and their constituent elements may not be repeated here.

According to the embodiments illustrated in FIG. 2, each row of multi-port (e.g., dual-port) memory devices 300 may be coupled to a dedicated pair of controller channels that are not shared with (e.g., coupled to) any other row of multi-port memory devices 300. For example, first and second channels 108-0 and 108-1 may be dedicated to a first row of multi-port memory devices 300 and coupled to respective ones of the first and second ports 112a and 112b of the first row of multi-port memory devices 300. Similarly, $(2N-1)^{th}$ and $2N^{th}$ channels 108-(2N-2) and 108-(2N-1) (where N is an integer greater than 1) are dedicated to the $N^{th}$ row of multi-port memory devices 300. As a result, the controller 104 can concurrently (e.g., simultaneously) access two multi-port memory devices 300 at each of the N rows. While nearly doubling the number of channels utilized, as compared to the storage node 100 of FIG. 1, the storage node 100-1 further increases memory availability, which results in greater performance improvements relative to the storage node 100.

Figure 3:
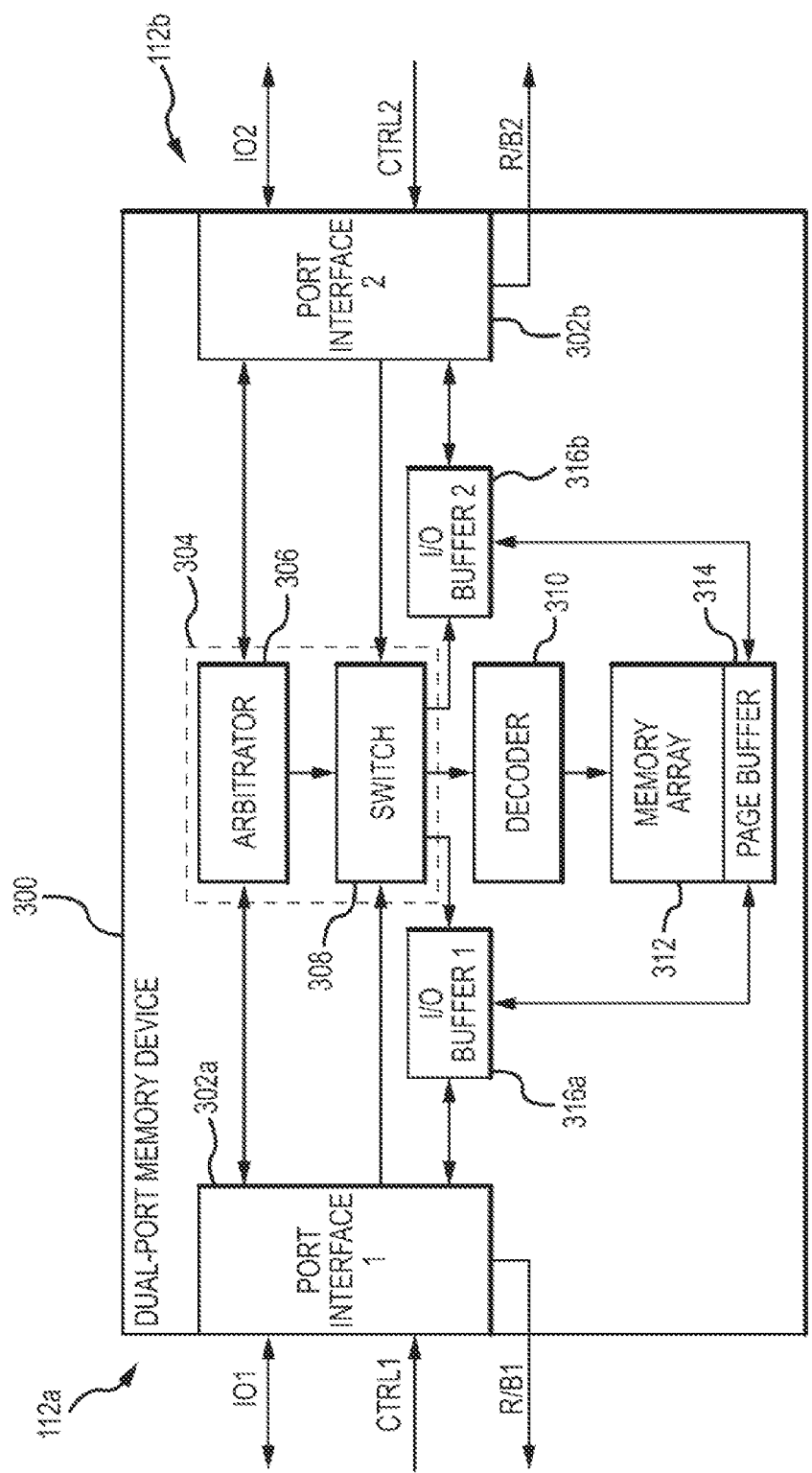
FIG. 3 is a block diagram of a multi-port memory device, according to some embodiments of the present invention.

FIG. 3 is a block diagram of a multi-port (e.g., a dual-port) memory device 300, according to some embodiments of the present invention.

Referring to FIG. 3, the multi-port memory device 300 includes a first port interface 302a at the first port 112a, a second port interface 302b at the second port 112b, a router 304, a decoder 310, a memory array 312, a page buffer 314, a first I/O buffer 316a and a second I/O buffer 316b.

According to some embodiments, the first port interface 302a is coupled to the controller 104/104-1 via a first channel, and the second port interface 302b is coupled to the controller 104/104-1 via a second channel that is separate and distinct from the first channel. In response to a first control signal $CTRL_1$ received from the first channel and an affirmative determination by the router 304, the first port interface 302a enables data transfer through the first port to/from the memory array 312. The first port interface 302a further transmits a first status signal (e.g., a ready busy signal) $R/B_1$ to the controller 104/104-1 indicating a ready state or a busy state of the first port interface 302a. For example, when at a logical low value (e.g., a low voltage), the first status signal $R/B_1$ indicates that the multi-port memory device 300 is busy, that is, has an operation (e.g., a read or write operation) in progress. On the other hand, a logical high value (e.g., a high voltage) may indicate that the multi-port memory device 300 is ready (or idle), that is, is not engaged in any operation. However, embodiments of the present invention are not limited thereto, and the logic values (and the corresponding voltage levels) of the ready or busy signals may be reversed. The second port interface 302b may operate in the same or substantially the same manner as the first port interface 302a, but with respect to the second control signal $CTRL_2$ received from the second channel, therefore, a detailed description thereof may not be repeated here.

Thus, the multi-port memory device 300 is capable of accepting and interpreting commands independently through the first and second port interfaces 302a and 302b.

According to some embodiments, the router 304 is in communication with the first and second port interfaces 302a and 302b, and permits access to the memory array 312 by one of the first and second port interfaces 302a and 302b based on at least one of the received first control signal $CTRL_1$ and the second control signal $CTRL_2$.

In some embodiments, the router 304 includes an arbitrator (e.g., an arbitration logic unit) 306 and a switch (e.g., switch logic unit) 308. The arbitrator 306 permits the controller 104 to access the memory array 312 for data transfer through one of the first and second port interfaces 302a and 302b. The arbitrator 306 may select which of the first and second port interfaces 302a and 302b to enable for data transfer based on at least one of the first and second control signals $CTRL_1$ and $CTRL_2$ that are received from the controller 104. For example, when a request for a data transfer is received via the first control signal $CTRL_1$ through the first port interface 302a, and the memory device 300 is not already servicing another data request by the controller 104, the arbitrator 306 enables access to the memory array 312 through the first port interface 302a for data transfer, and blocks access through the second port interface 302b. At this time, the first and second port interfaces 302a and 302b may change their respective status signals $R/B_1$ and $R/B_2$ to reflect a busy state. In such an example, access to the second port interface 302b remains blocked until the data transfer through the first port 112a is complete, at which time, the first and second port interfaces 302a and 302b may change their respective status signals $R/B_1$ and $R/B_2$ to reflect a ready state. Thus, at any given time, the memory device 300 may be accessed through the first port 112a or the second port 112b.

In response to a port selection by the arbitrator 306, the switch 308 routes the control signal received from the selected port to the decoder 310 and routes the corresponding data into and/or out of the memory array 312.

The decoder 310 is coupled to the router 304 (e.g., the switch 308) and interprets (e.g., decodes) the selected one of the received first and second control signals $CTRL_1$ and $CTRL_2$ to determine a data operation (e.g., a read operation or a write operation) to perform, and to perform the data operation using the memory array 312.

The memory array 312 may include a plurality of memory cells arranged in a matrix form having crossing rows and columns of memory cells, which store the data provided by the controller 104. The memory cells may include NAND memory cells, NOR memory cells, vertical NAND memory cells, resistive memory cells, phase-change memory cells, ferroelectric memory cells, spin-transfer-torque memory, and/or the like. The page buffer 314 latches data that is being read from or written into the memory array 312 on a page by page basis.

The first and second I/O buffers 316a and 316b function as temporary storage during read operations through the first and second ports 112a and 112b, respectively. For example, when the router 304 activates the first port interface 302a for servicing a read operation therethrough, the router 304 (e.g., the switch 308) enables the first I/O buffer 316a to receive the requested data, page by page, from the page buffer 314. Once a preset size of the requested data (e.g., the entire requested data) is retrieved from the memory array 312 and buffered, the first I/O buffer 316a releases the buffered data to the first port interface 302a for transmission back to the controller 104 through the first channel. The second I/O buffer 316b operate in the same or substantially the same manner as the first I/O buffer 316a, therefore a description thereof may not be repeated here.

Figure 4:
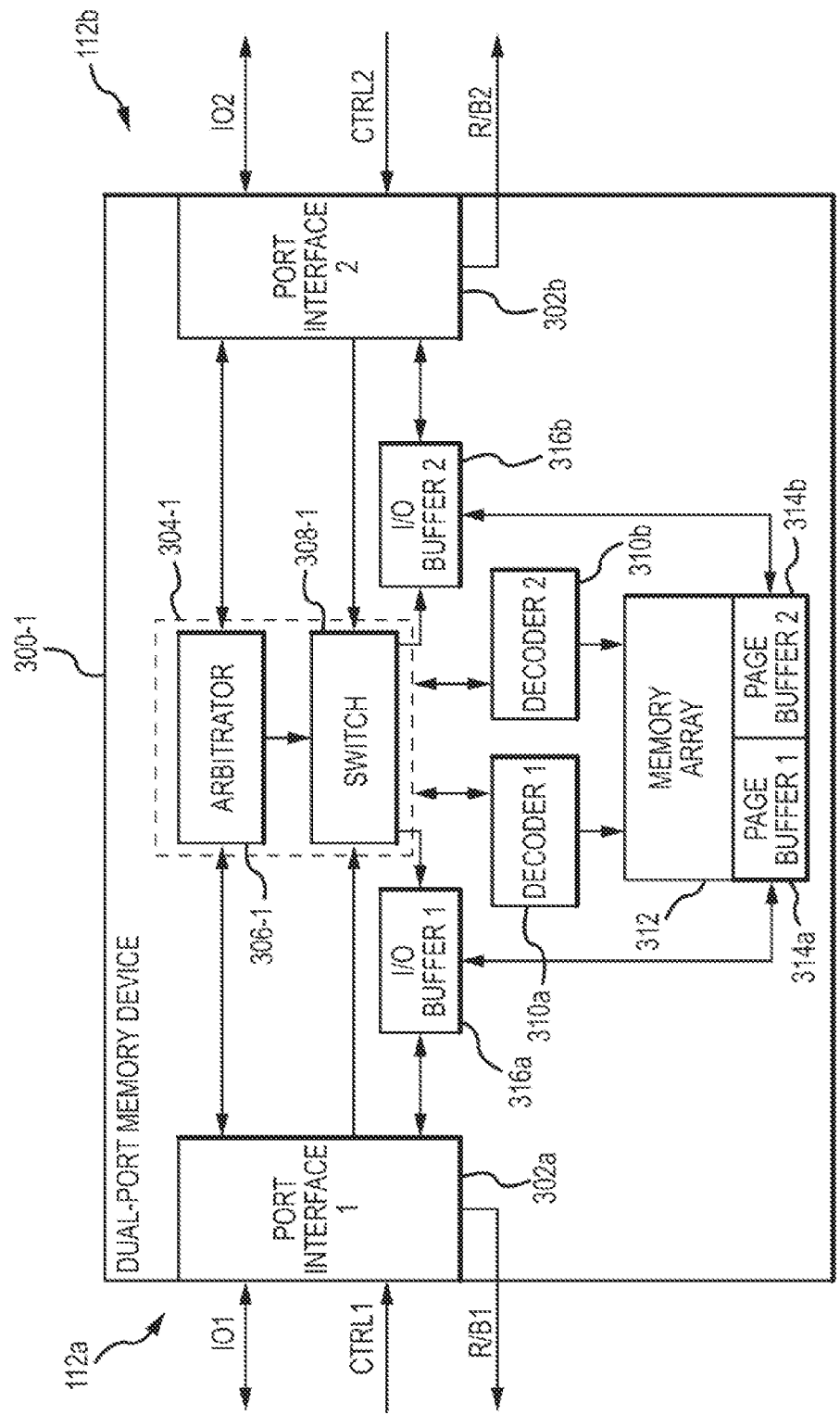
FIG. 4 is a block diagram of a multi-port memory device, according to some other embodiments of the present invention.

FIG. 4 is a block diagram of a multi-port (e.g., a dual-port) memory device 300-1, according to some other embodiments of the present invention. The multi-port memory device 300-1 is similar in structure and operation to, and shares many elements in common with, the multi-port memory device 300 described above with respect to FIG. 3. As such, a description of common elements and functions will not be repeated here, and the following will primarily describe aspects of the multi-port memory device 300-1 that are different from those of the multi-port memory device 300 by way of example.

Referring to FIG. 4, the multi-port memory device 300-1 may enable concurrent access to the memory array 312 through both of the first and second ports 112a and 112b. For example, when the first port 112a is processing a request by the controller 104 (i.e., a first data transfer) as outlined above (with respect to FIG. 3), the router 304-1 (e.g., the arbitrator 306-1) may not automatically block access through the second port interface 302b, and the second status signal R/B$_2$ may indicate a ready state, while the first status signal R/B$_1$ indicates a busy state. Further, the first data transfer may be processed via the first decoder 310a and the first page buffer 314a. In such an example, when a second data transfer request is received via the second control signal CTRL$_2$, the router 304-1 may determine whether the second data transfer requires access to a part of the memory array 312 that is being accessed for processing the first data transfer. If there is any overlap, the router 304-1 (e.g., the arbitrator 306-1) may queue the second request until after completion of the first data transfer. If the router 304-1 determines that there is no overlap in memory cell access between the two requests, the arbitrator 306-1 proceeds to enable access to the memory array 312 through the second port interface 302b for data transfer. At this time, the second port interface 302b changes the second status signal R/B$_2$ to reflect a busy state.

Then, the router 304-1 (e.g., the switch 308-1) routes the control signal received from the second port 112b to the second decoder 310b and routes the corresponding data in and out of the memory array 312. The second decoder 310b interprets (e.g., decodes) the second control signal CTRL$_2$ to determine a data operation (e.g., a read operation or a write operation) to perform, and to perform the data operation using the memory array 312, the second page buffer 314b, and the second I/O buffer 316b.

Thus, according to some embodiments of the present invention, the multi-port memory device 300-1 is capable of concurrent memory access through both of its first and second ports 112a and 112b.

While, in the above, the operation of the storage nodes 100 and 100-1 of FIGS. 1-2 were described with respect to the multi-port memory device 300, the present invention is not limited thereto. That is, in the embodiments of FIGS. 1-2, the multi-port memory device 300 may be replaced with the multi-port memory device 300-1.

Figure 5:
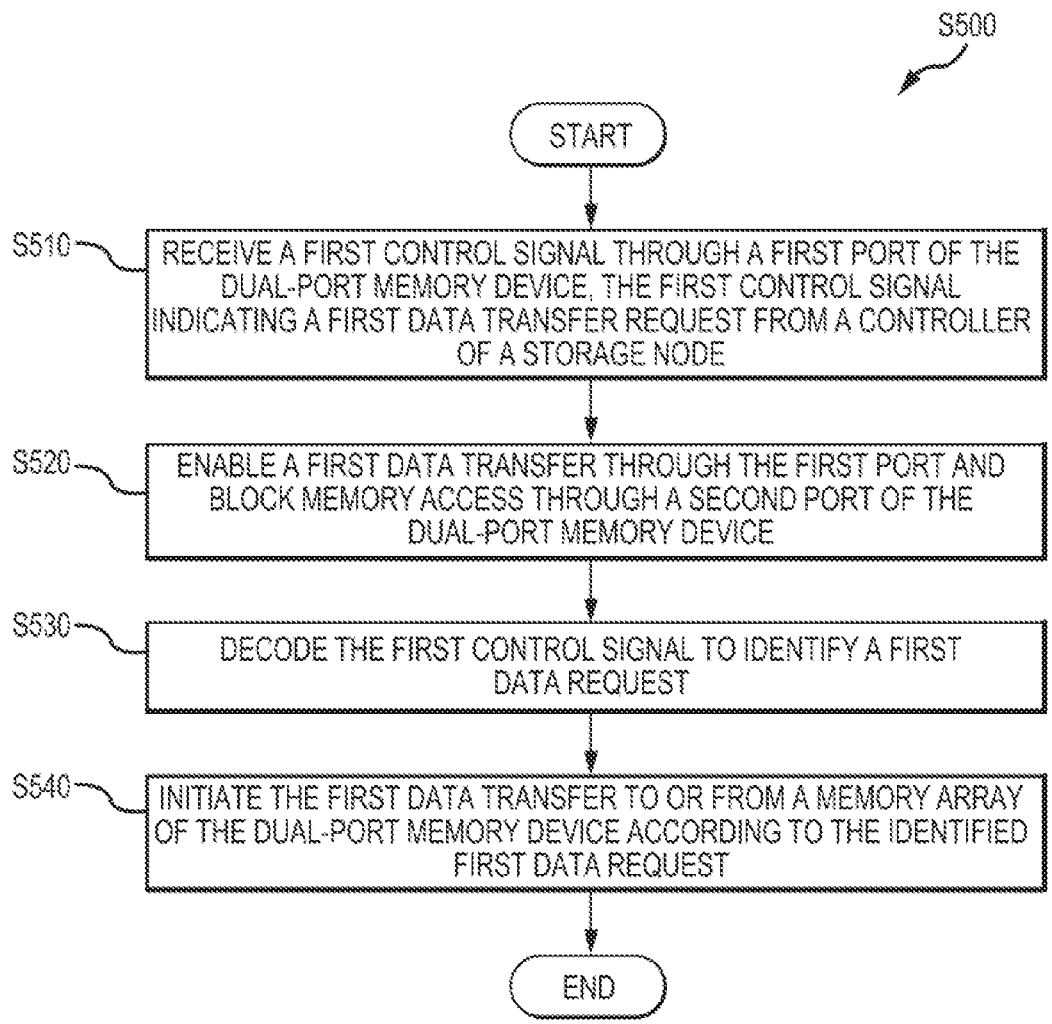
FIG. 5 is a flow diagram of a process for performing data transfer in a multi-port memory device, according to some example embodiments of the present invention.

FIG. 5 is a flow diagram of a process S500 for performing data transfer in a multi-port (e.g., a dual-port) memory device 300/300-1, according to some example embodiments of the present invention.

In act S510, the multi-port memory device 300/300-1 (e.g., the first port interface 302a) may receive a first control signal CTRL$_1$, which indicates a first data transfer request from the controller 104, through the first port 112a.

In act S520, the multi-port memory device 300/300-1 (e.g., the router 306/306-1) enables a first data transfer through the first port 112a and blocks memory access through the second port 112b. In some embodiments, the multi-port memory device 300 (e.g., the first port interface 302a) transmits first and second status signals R/B$_1$ and R/B$_2$ from the first and second ports 112a and 112b indicating a busy state. In other embodiments, the multi-port memory device 300-1 (e.g., the first port interface 302a) transmits a first status signal R/B$_1$ from the first port 112a indicating a busy state and a second status R/B$_2$ signal from the second port 112b indicating a ready state.

In act S530, the multi-port memory device 300/300-1 (e.g., the decoder 310/310a) decodes the first control signal CTRL$_1$ to identify the first data request and, in act 540, initiates the first data transfer to/from the memory array 312 (from/to the controller 104) through the first port 112a based on the identified first data request.

Figure 6:
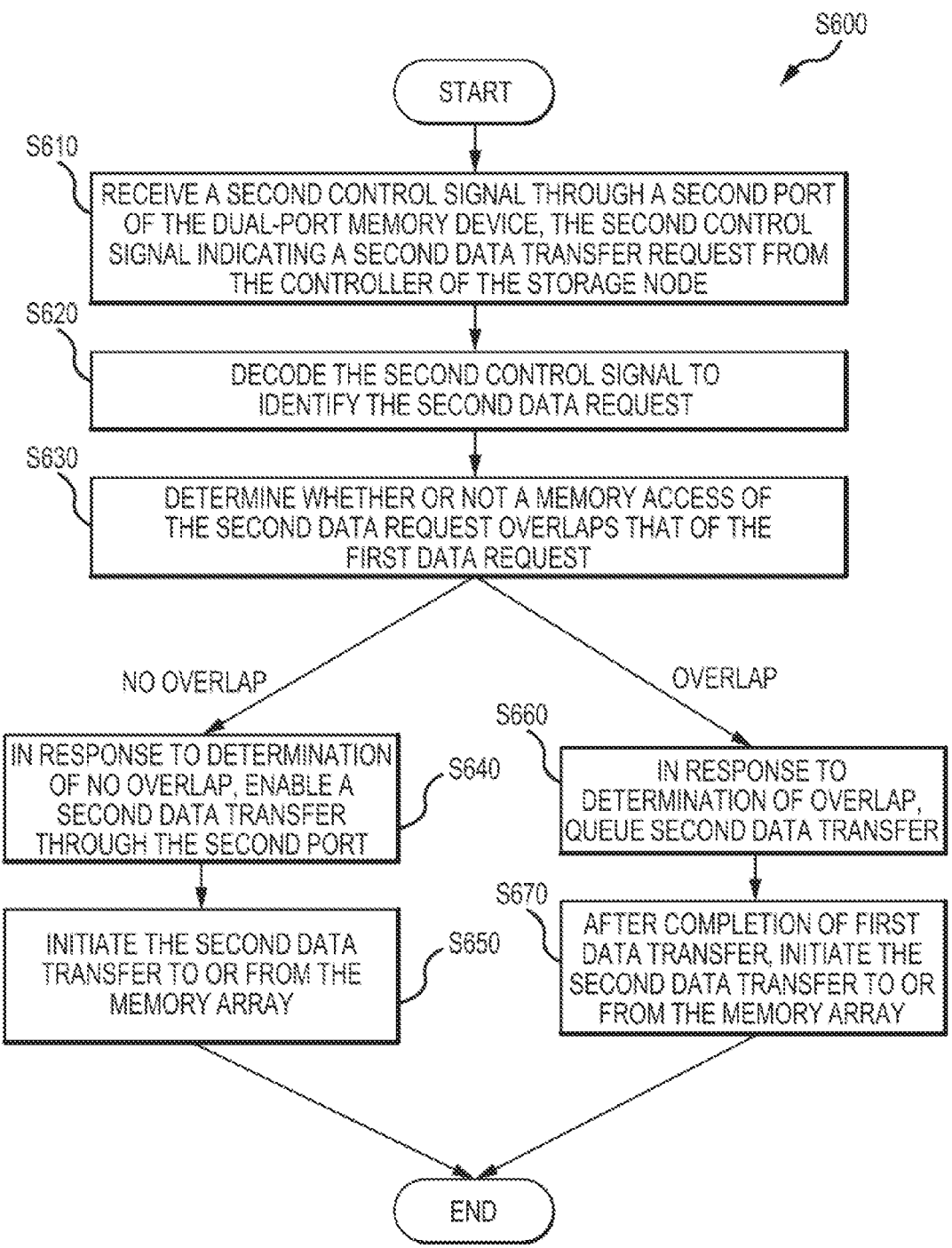
FIG. 6 is a flow diagram of a process for performing a second data transfer in a multi-port memory device that is already engaged in a first data transfer, according to some example embodiments of the present invention.

FIG. 6 is a flow diagram of a process S600 for performing a second data transfer in a multi-port (e.g., a dual-port) memory device 300-1 that is already engaged in a first data transfer, according to some example embodiments of the present invention.

In act S610, while the multi-port memory device 300-1 is engaged in processing a first data request from the controller 104 through the first port 112a, the multi-port memory device 300-1 (e.g., the second port interface 302b) may receive a second control signal CTRL$_2$, which indicates a second data transfer request from the controller 104, through the second port 112b.

In act S620, the multi-port memory device 300-1 (e.g., the second decoder 310b) decodes the second control signal CTRL$_2$ to identify the second data request.

In act 630, the multi-port memory device 300-1 (e.g., the router 304-1) determines whether or not the memory access of the second data transfer overlaps with that of the first data transfer.

If a determination is made that there is no overlapping memory access (i.e., the first and second data requests do not access any same pages of memory in the memory array 312), in act 640, the multi-port memory device 300-1 (e.g., the router 304-1) enables the second data transfer through the second port 112b while the first port 112a is engaged in processing the first data transfer. Then, in act 650, the multi-port memory device 300-1 (e.g., the router 304-1) initiates the second data transfer to or from the memory array 312 of the multi-port memory device (from/to the controller 104) through the second port 112b based on the identified second data request. In some embodiments, the multi-port memory device 300-1 (e.g., the second port interface 302b) transmits a second status signal $R/B_2$ from the second port 112b indicating a busy state.

If in act 630 a determination is made that the memory access of the second data transfer overlaps that of the first data transfer (i.e., the first and second data requests access at least one common page of memory in the memory array 312), in act 660, the multi-port memory device 300-1 (e.g., the router 304-1) queues the second data transfer until after the first data transfer through the first port 112a is complete. After the completion of the first data transfer, in act S670, the multi-port memory device 300-1 (e.g., the router 304-1) initiates the second data transfer to or from the memory array 312 of the multi-port memory device (from/to the controller 104) through the second port 112b based on the identified second data request.

The first and second port interfaces 302a and 302b, the router 304/304-1, and the decoder 310/310a/310b, and in general, the multi-port memory device 300/300-1 may be implemented utilizing any suitable hardware (e.g. an application-specific integrated circuit), firmware software, or a suitable combination of software, firmware, and hardware. For example, the various components of the multi-port memory device 300/300-1, such as the first and second port interfaces 302a and 302b, the router 304/304-1, and the decoder 310/310a/310b may be formed on one integrated circuit (IC) chip or on separate IC chips. Further, the various components of the multi-port memory device 300/300-1 may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM).

In the following claims, processor and processor memory represent a consolidation of the first and second port interfaces 302a and 302b, the router 304/304-1, and the decoder 310/310a/310b.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

It will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "example" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A storage node comprising:
    a first multi-port memory device comprising a first port and a second port; and
    a second multi-port memory device comprising a first port and a second port; and
    a controller configured to perform data transfer to/from the first and second multi-port memory devices through a first channel and a second channel,
    wherein the second port of the first multi-port memory device and the first port of the second multi-port memory device are both connected to, and in communication with the controller through, the second channel.

2. The storage node of claim 1, wherein the first port and the second port of the first multi-port memory device and the first port and the second port of the second multi-port memory device are configured to receive data transfer requests from the controller.

3. The storage node of claim 1, wherein the first port of the first multi-port memory device is coupled to, and in communication with the controller through the first channel.

4. The storage node of claim 1, wherein the second multi-port memory device comprises:
    a memory array for storing data provided by the controller;
    the first port of the second multi-port memory device coupled to and in communication with the controller via the second channel; and the second port of the second multi-port memory device coupled to and in communication with the controller via a third channel of the storage node.

5. The storage node of claim 4, wherein the second multi-port memory device further comprises:
a processor; and
a processor memory local to the processor, wherein the processor memory has stored thereon instructions that, when executed by the processor, cause the processor to:
enable data transfer through the first port and/or the second port of the second multi-port memory device in response to a first control signal received from the second channel and/or a second control signal received from the third channel;
decode at least one of the received first and second control signals to identify a data operation to perform, the identified data operation comprising a read or write operation from or to the memory array; and
execute the identified data operation.

6. The storage node of claim 1, wherein the storage node further comprises a host interface configured as a communication medium between the controller and a host.

7. A storage node comprising:
one or more multi-port memory devices comprising:
a first multi-port memory device comprising a first port and a second port; and
a second multi-port memory device comprising a first port and a second port; and
a controller configured to perform data transfer to/from the one or more multi-port memory devices through one or more channels comprising a first channel, a second channel, and a third channel,
wherein the second port of the first multi-port memory device and the first port of the second multi-port memory device are both connected to, and in communication with the controller through, the second channel, and
wherein the second port of the second multi-port memory device is connected to, and in communication with the controller through, the third channel.

8. The storage node of claim 7, wherein the one or more multi-port memory devices are arranged in rows of the one or more multi-port memory devices.

9. The storage node of claim 8, wherein a number of the one or more channels is greater than that of the rows of the one or more multi-port memory devices.

10. The storage node of claim 8, wherein a number of the one or more channels is the same as that of the rows of the one or more multi-port memory devices, and the first channel of the one or more channels is coupled to both a first row of the rows of the one or more multi-port memory devices and a last row of the rows of the one or more multi-port memory devices.

11. The storage node of claim 7, wherein the first port and the second port of the first multi-port memory device and the first port and the second port of the second multi-port memory device are configured to receive data transfer requests from the controller.

12. The storage node of claim 7, wherein the first port of the first multi-port memory device is coupled to, and in communication with the controller through the first channel.

13. The storage node of claim 7, wherein the second multi-port memory device comprises:
a memory array for storing data provided by the controller;
the first port of the second multi-port memory device coupled to and in communication with the controller via the second channel; and
the second port of the second multi-port memory device coupled to and in communication with the controller via the third channel of the one or more channels of the storage node.

14. The storage node of claim 13, wherein the second multi-port memory device further comprises:
a processor; and
a processor memory local to the processor, wherein the processor memory has stored thereon instructions that, when executed by the processor, cause the processor to:
enable data transfer through the first port and/or the second port of the second multi-port memory device in response to a first control signal received from the second channel and/or a second control signal received from the third channel;
decode at least one of the received first and second control signals to identify a data operation to perform, the identified data operation comprising a read or write operation from or to the memory array; and
execute the identified data operation.

15. The storage node of claim 13, wherein the storage node further comprises a host interface configured as a communication medium between the controller and a host.

16. A storage node comprising:
one or more multi-port memory devices arranged in rows of the one or more multi-port memory devices, the one or more multi-port memory devices comprising:
a first multi-port memory device comprising a first port and a second port; and
a second multi-port memory device comprising a first port and a second port;
a third multi-port memory device comprising a first port and a second port; and
a controller configured to perform data transfer to/from the one or more multi-port memory devices through one or more channels comprising a first channel, a second channel, and a third channel,
wherein the first port of the first multi-port memory device is coupled to, and in communication with the controller through the first channel, and wherein the second port of the first multi-port memory device and the first port of the second multi-port memory device are both connected to, and in communication with the controller through, the second channel, and
wherein the second port of the second multi-port memory device and the first port of the third multi-port memory device are both connected to, and in communication with the controller through, the third channel.

17. The storage node of claim 16, wherein a number of the one or more channels is greater than that of the rows of the one or more multi-port memory devices.

18. The storage node of claim 16, wherein a number of the one or more channels is the same as that of the rows of the one or more multi-port memory devices, and the first channel of the one or more channels is coupled to both a first row of the rows of the one or more multi-port memory devices and a last row of the rows of the one or more multi-port memory devices.

19. The storage node of claim 16, wherein the first port and the second port of the first multi-port memory device, the first port and the second port of the second multi-port memory device, and the first port and the second port of the third multi-port memory device are configured to receive data transfer requests from the controller.

20. The storage node of claim 16, wherein the first multi-port memory device comprises:
- a memory array for storing data provided by the controller;
- the first port coupled to the controller via the first channel;
- the second port coupled to the controller via the second channel;
- a processor; and
- a processor memory local to the processor, wherein the processor memory has stored thereon instructions that, when executed by the processor, cause the processor to:
  - enable data transfer through the first port and/or the second port in response to a first control signal received from the first channel and/or a second control signal received from the second channel;
  - decode at least one of the received first and second control signals to identify a data operation to perform, the identified data operation comprising a read or write operation from or to the memory array; and
  - execute the identified data operation.

\* \* \* \* \*